United States Patent [19]
Hosoe

[11] Patent Number: 5,291,315
[45] Date of Patent: Mar. 1, 1994

[54] METHOD OF OBTAINING HOLOGRAM AND AN EXPOSURE APPARATUS

[75] Inventor: Shigeru Hosoe, Tokyo, Japan
[73] Assignee: Konica Corporation, Tokyo, Japan
[21] Appl. No.: 65,449
[22] Filed: May 21, 1993

Related U.S. Application Data

[63] Continuation of Ser. No. 744,817, Aug. 12, 1991, abandoned, which is a continuation of Ser. No. 381,844, Jul. 19, 1989, abandoned.

[30] Foreign Application Priority Data

Jul. 26, 1988 [JP] Japan .................... 63-98004

[51] Int. Cl.⁵ .................... G03H 1/02; G02B 5/32; G01B 9/021
[52] U.S. Cl. .................... 359/3; 359/1; 359/9; 359/15; 359/35; 430/1; 430/2; 430/321; 356/347
[58] Field of Search .............. 356/347; 350/3.66, 3.60; 359/1, 3, 9, 15, 35, 565; 430/321, 397, 1, 2

[56] References Cited

U.S. PATENT DOCUMENTS

| | | | |
|---|---|---|---|
| 3,953,129 | 4/1976 | Hildebrand | 350/3.6 X |
| 4,025,731 | 5/1977 | Rembault | 359/35 |
| 4,032,343 | 6/1977 | Deml et al. | 430/397 |
| 4,104,489 | 8/1978 | Satoh et al. | 359/9 |
| 4,402,571 | 9/1983 | Cowan et al. | 359/574 |
| 4,458,345 | 7/1984 | Bjorklund et al. | 359/3 |
| 4,510,575 | 4/1985 | Mueller et al. | 350/3.6 X |
| 4,895,790 | 1/1990 | Swanson et al. | |
| 4,936,665 | 6/1990 | Whitney | 359/571 |
| 5,045,438 | 9/1991 | Adachi | 340/397 |

FOREIGN PATENT DOCUMENTS 7814468 12/1978 France .................... 350/3.66

OTHER PUBLICATIONS

MacGovern, A. J. and Wyant, J. C. "Computer Generated Holograms for Testing Optical Elements" *Applied Optics*, Mar. 1971, vol. 10, No. 3 pp. 619–624 350–3.66.
L. d'Auria, et al., "Photolithographic Fabrication of Thin Film Lenses," Optics Communications, 5:4, Jul., 1972.

*Primary Examiner*—Scott J. Sugarman
*Assistant Examiner*—David R. Parsons
*Attorney, Agent, or Firm*—Finnegan, Henderson, Farabow, Garrett & Dunner

[57] ABSTRACT

A hologram exposure apparatus for and method of obtaining a hologram using a photoresist for an in-line type interferometer wherein a photoresist substrate is detachably mounted on a substrate rotating device. A concentric pattern of a hologram from a source of light is projected onto the photoresist on the substrate mounted on the substrate rotating device while rotating the substrate and moving a projecting device in a direction at right angles with the rotary shaft of the photoresist substrate.

12 Claims, 1 Drawing Sheet

METHOD OF OBTAINING HOLOGRAM AND AN EXPOSURE APPARATUS

This application is a continuation of application Ser. No. 07/744,817, filed Aug. 12, 1991, now abandoned, which is a continuation of application Ser. No. 07/381,844, filed Jul. 19, 1989, now abandoned.

BACKGROUND OF THE INVENTION

1. Field of the Invention

This invention relates to a method of obtaining a hologram using a photoresist used for an in-line type computer hologram interferometer (hereinafter simply referred to an interferometer), and to a hologram exposure apparatus.

2. Description of the Prior Art

An interferometer is quite often used for measuring optical surfaces of non-spherical shapes and for measuring known shapes maintaining high precision. In particular, an interferometer of the in-line type is used for measuring the optical surfaces of an axis-symmetrical lens and the shape of the metal mold surfaces for press-molding the lenses. In the interferometer of the in-line type, a reference light and a light from an object to be measured are coaxially arranged so that a pattern of the hologram describes concentric circles. When the object light has spherical waves, it is allowed to measure deep shapes compared to the pattern pitch of the hologram and the optical system becomes almost common to the reference light and the object light, making it possible to suppress error caused by the optical system. The hologram used for the in-line interferometer has heretofore been obtained by a method according to which a concentric pattern of the hologram is found by a computer and is drawn using an X-Y plotter followed by taking a picture thereof, or by a method according to which a photoresist is exposed using an electron beam drawing apparatus instead of using the X-Y plotter or taking a picture of it.

According to the method which uses the X-Y plotter and takes a picture, however, the concentric pattern of the hologram tends to develop distortion, coma and spherical aberration due to such factors as precision of the X-Y plotter, precision for setting at the time of taking a picture, illumination and exposure conditions, and processing conditions for developing. Moreover, the processing becomes complex. According to the method of using an electron beam drawing apparatus, on the other hand, the drawing precision is considerably high for a narrow range of drawing. When the drawing range is expanded, however, leakage of magnetic flux increases from the electromagnetic lens and an extended exposure time is required. Therefore, the drawing position drifts causing the drawing precision to decrease. If it is attempted to eliminate this defect, the apparatus becomes bulky and expensive. Generally, the electron beam drawing apparatus is expensive by its own nature and has a drawing range of a square having a side of about 5 mm, and is not suited for obtaining a hologram.

SUMMARY OF THE INVENTION

This invention was accomplished in order to solve the above-mentioned problems, and its object is to provide a method of obtaining a hologram using a photoresist that is used for an in-line interferometer, by exposing a concentric pattern of hologram uniformly maintaining a high drawing precision irrespective of the drawing range on the photoresist, as well as to provide an exposure apparatus.

For this purpose, this invention deals with a hologram exposure apparatus for obtaining a hologram using a photoresist for an in-line type interferometer, comprising substrate rotating means on which a photoresist substrate is detachably mounted, projecting means for projecting a ray of light from a source of light onto the photoresist on the substrate mounted on the substrate rotating means, moving means for linearly moving the projecting means or the substrate rotating means in a direction at right angles with the rotary shaft of the photoresist substrate, and a control unit which so controls the above means that the ray of light is incident from the projecting means upon a photoresist on the substrate while rotating the photoresist substrate by the substrate rotating means and that the position on which said ray of light is incident is further moved by the moving means.

A method of obtaining a hologram of this invention comprising the steps of placing a substrate on a substrate-mounting plate, rotating the substrate-mounting plate while dropping a photoresist solution onto the center of rotation of the substrate, and exposing a concentric pattern of a hologram on a photoresist thus formed on the substrate from projecting means while rotating the substrate and moving the projecting means in a direction at right angles with the rotary shaft of the substrate-mounting plate.

According to the present invention a ray of light is permitted to be incident upon the photoresist from the projecting means under the control of a control unit, a photoresist substrate is rotated by the substrate rotating means, and the projecting means and the substrate rotating means are moved relative to one another by moving means in order to move the position at which the ray of light falls on the photoresist. For example, the projecting means can be moved in a direction which is parallel to the plane of the photoresist. Therefore, the photoresist is exposed to the concentric pattern of the hologram uniformly maintaining a high drawing precision irrespective of the range of drawing.

Other objects and features of the present invention will become obvious from the following description taken in conjunction with the accompanying drawing.

DESCRIPTION OF THE PREFERRED EMBODIMENTS

Figure 1:
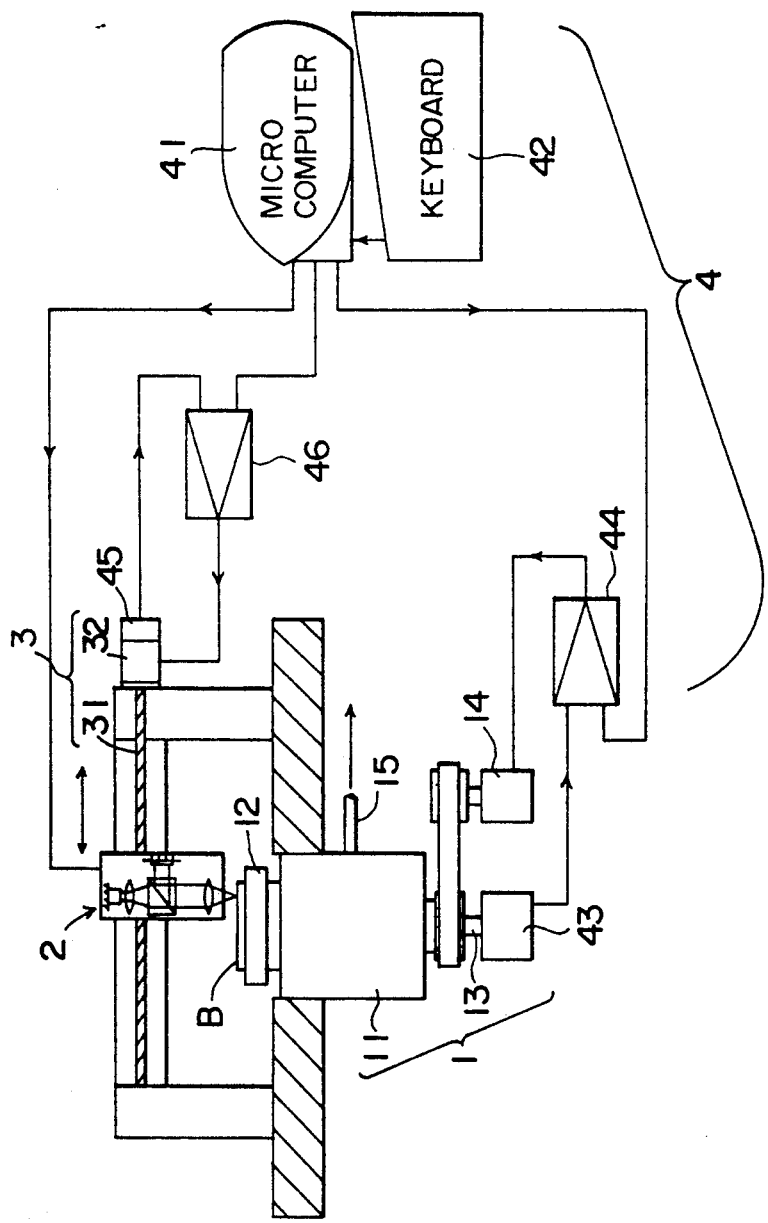
FIG. 1 schematically illustrates the constitution of a hologram exposure apparatus according to this invention.

In FIG. 1, reference numeral 1 denotes substrate rotating means, 2 denotes projecting means, 3 denotes moving means, and 4 denotes a control unit. The substrate rotating means 1 consists of a precision bearing 11 such as an air bearing, a rotary shaft 13 that is rotatably supported by the bearing 11 and that has a substrate-mounting plate 12 at the upper end thereof to mount a substrate B by vacuum chuck, and a DC motor 14 for rotating the rotary shaft 13. The projecting means 2 consists of an optical system made up of a source of laser beam, an expander lens, a deflector plate, a beam splitter, a reflector surface and a focusing lens, and a lens drive mechanism which moves the focusing lens to automatically focus the image. The lens drive mechanism may be a widely known one that is used for a CD player and the like. The moving means 3 consists of a feed screw 31 for linearly moving the projecting means 2 in parallel with the upper surface of the substrate-mounting plate 12 of the substrate rotating means 1, and a DC motor 32 for rotating the feed screw 31. The control unit 4 consists of a micro computer 41, a keyboard 42, a rotation detector 43 and an amplifier 44 for controlling the motor 14 in the substrate rotating means 1, and a rotation detector 45 and an amplifier 46 for controlling the motor 32 in the moving means 3.

Described below is how to obtain a hologram using the above-mentioned apparatus. First, the substrate B made of a glass is placed on the substrate-mounting plate 12 of the substrate rotating means 1 and is secured by vacuum chuck. A suction pipe 15 of vacuum chuck protrudes from the bearing 11. Next, the substrate-mounting plate 12 on which the substrate is mounted is rotated at 3000 to 5000 rpm, a photoresist solution is dropped onto the center of rotation of the substrate B by suitable means such as syringe or burette, and the rotation of the substrate-mounting plate 12 is discontinued at a moment when the photoresist solution has sufficiently spread up to the periphery of the substrate B. A photoresist film is thus formed uniformly on the substrate B maintaining a thickness of 1 to 5 $\mu$m. Next, the substrate-mounting plate 12 is rotated, and the photoresist on the substrate B is exposed to the concentric pattern of hologram by the projecting means 2 while moving the projecting means by the moving means 3 in a direction at right angles with the rotary shaft of the substrate-mounting plate 12. The exposure inclusive of the preparatory procedure is completed in about one hour though it varies depending upon the kind of photoresist and the source of laser beam. After the exposure is finished, the substrate B having the exposed photoresist is removed from the substrate-mounting plate 12 and is then treated in the same manner as the conventional method of obtaining a hologram using photoresist in order to obtain a hologram.

Upon receipt of instructions from the keyboard 42, the micro computer 41 controls the substrate rotating means 1 to apply the photoresist coating onto the substrate B and controls the projecting means to expose the photoresist to the concentric pattern. In particular, the exposure of the photoresist to the concentric pattern is controlled based on the calculation of a hologram pattern. That exposure is automatically carried out by the microcomputer 41 upon receiving coefficients of design functions of the shape of a sample from the keyboard 42, and by controlling the number of revolutions of the substrate B and the moving speed of the projection means 2 (i.e., by controlling the numbers of revolutions of the rotary shaft 13 and the feed screw 31 based on the calculated result), and by further controlling the incidence of laser beam upon the photoresist by the projecting means 2. The rotary shaft 13 and the feed screw 31 are rotated by the DC motors 14 and 32 which are driven by drive signals from the micro computer 41 through the amplifiers 44 and 46 in a manner that the rotation detectors 43 and 45 detect predetermined numbers of revolutions. The laser beam is projected from the projecting means 2 onto the photoresist in a manner that a spot of a diameter of about 1 $\mu$m is focused on the photoresist on the substrate B.

Deviation of the rotary shaft 13 can be easily decreased to smaller than about 0.05 $\mu$m on the exposure region if use is made of the air bearing 11. Further, the projection means 2 can be laterally fed by the feed screw 31 maintaining a positioning precision of about 0.1 $\mu$m over an exposure region based on the combination of an air slider and a servo motor. Therefore, the exposure to the concentric pattern by the projecting means 2 can be effected maintaining a high drawing precision, i.e., suppressing the pattern pitch error to be smaller than 0.1 $\mu$m irrespective of the drawing range. A bearing that has little deviation and highly precise laterally feeding means may be used in place of the air bearing and the feed screw. Moreover, it is also allowable to laterally feed the substrate rotating means 1 instead of laterally feeding the projecting means 2.

The laser beam must be projected along a straight line that passes through the center of rotation of the substrate B. For this purpose in this embodiment, the bearing 11 of the substrate rotating means 1 can be moved in the direction which the rotary shaft 13 extends and in a direction perpendicular to the direction in which the projection means 2 is fed by the feed screw 31. Not being limited to this, the laterally feeding means may also be moved in the similar directions. This adjustment may be accomplished by exposing a dummy resist substrate at a central position of rotation and then finding the quantities of adjustment from that result. Generally, the quality is not impaired provided the laser beam is not deviated by more than about ±10 $\mu$m from the center of rotation.

Figure 2:
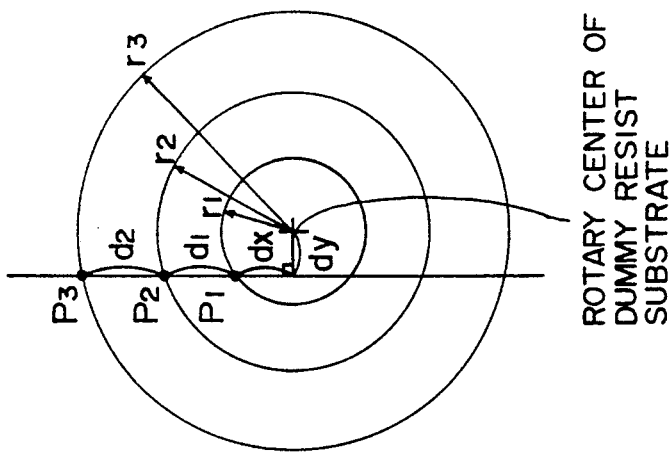
FIG. 2 shows concentric circles on a dummy resist substrate.

The concrete manner of the adjustment will be explained with reference to FIG. 2.

First, a substrate is placed on the substrate-mounting plate 12 and a photoresist film is formed on said substrate according to said hologram forming steps to obtain a dummy resist substrate.

While rotating the dummy resist substrate, a portion $P_1$ which is considered as the center of rotation of the dummy resist and a portion $P_2$ which is away from said portion $P_1$ by a linear distance $d_1$ (about 10–20 $\mu$m) are exposed with a laser beam. Further, a portion $P_3$ which is away from said portion $P_2$ by a distance $d_2$ (as long as $d_1$) is exposed with a laser beam, similarly.

According to the exposure, concentric patterns having radii $r_1$, $r_2$ and $r_3$, respectively are formed as traces of exposure when the dummy resist substrate is developed. Each radius $r_1 r_2$ or $r_3$ is measured by using a tool microscope.

By assuming that a deviation of the laser beam in the linear moving direction from the center co-ordinate is $d_x$, and a distance of the laser beam from the rotary center of the center co-ordinate is $d_y$, the following formulas can be obtained:

$$r_1 = \sqrt{d_x^2 + d_y^2}, \quad (1)$$

$$r_2 = \sqrt{(d_x + d_1)^2 + d_y^2}. \quad (2)$$

From the formulas (1) and (2)

$$d_x = \frac{r_2^2 - r_1^2 - d_1^2}{2 \cdot d_1}, \quad (3)$$

From the formulas (3) and (1)

$$d_y = \pm \sqrt{r_1^2 - d_x^2}. \quad (4)$$

From the formula (3), (4), $d_x$ and $d_y$ can be obtained.

Further $r_3$ is used for discriminating which is $r_1$, if $r_1$ and $r_2$ are near to each other.

With respect to $d_y$, positive and negative values can result from the formula (4). However, it can be determined that whether the direction of correction is true or not by correcting about 90% of $d_y$ thus calculated and the dummy resist substrate is exposed again.

By repeating the above step two or three times (through about ten minutes), $d_x$ and $d_y$ can be decreased to smaller than 1 μm, respectively and accordingly this method has a very high utility.

Further, if this exposure routine is programmed in the micro computer, the workability can be enhanced.

In the above embodiment, a dummy resist substrate is formed at first. However, it may be acceptable that the dummy resist substrate is formed previously and then placed on the substrate-mounting plate.

According to this invention, the photoresist is exposed to the concentric pattern of the hologram uniformly maintaining a high drawing precision irrespective of the drawing range, and a hologram of high precision is obtained that can be used for the in-line interferometers.

What is claimed is:

1. An apparatus for exposing a photoresist deposited on a substrate to form a hologram pattern for use in an in-line type interferometer, comprising:
    means for generating an electrical signal corresponding to a hologram pattern;
    means for rotating the substrate upon which the photoresist is deposited, the substrate being detachably mounted on the rotating means;
    means for projecting a laser beam corresponding to the electrical signal onto the photoresist, wherein the projecting means includes an optical system for projecting a beam spot of the laser beam on a surface of the photoresist so as to expose the photoresist to the hologram pattern;
    means for linearly moving the projecting means or the substrate rotating means relative to one another in a direction parallel to the plane of the photoresist; and
    means for controlling the rotating means, projecting means, and moving means based on the electrical signal so that the beam spot projecting by the projecting means onto one photoresist is moved by the moving means to provide the hologram pattern on the photoresist.

2. The apparatus of claim 1, wherein the moving means moves the projecting means relative to the substrate rotating means.

3. The apparatus of claim 2, wherein the moving means is comprises an air-slider for obtaining a high degree of accuracy of movement.

4. The apparatus of claim 2, wherein the rotating means comprises an air-bearing for obtaining a high degree of accuracy of rotation.

5. The apparatus of claim 2, further comprising:
    means for supplying a photoresist solution to the substrate rotated by the rotating means so as to make the photoresist.

6. The apparatus of claim 2, further comprising:
    means for calculating the hologram pattern to be exposed on said photoresist, wherein said generating means generates the electrical signal based on the calculation by the calculating means.

7. The apparatus of claim 1, wherein the moving means moves the substrate rotating means relative to the projecting means.

8. The apparatus of claim 7, wherein the moving means comprises an air-slider for obtaining a high degree of accuracy of movement.

9. The apparatus of claim 7, wherein the rotating means comprises an air-bearing for obtaining a high degree of accuracy of rotation.

10. The apparatus of claim 7, further comprising:
    means for supplying a photoresist solution to the substrate rotated by the rotating means so as to make the photoresist.

11. The apparatus of claim 7, further comprising:
    means for calculating the hologram pattern to be exposed on said photoresist, wherein said generating means generates the electrical signal based on the calculation by the calculating means.

12. A method of exposing a photoresist on a substrate to form an optical element for use in an in-line type interferometer, comprising the steps of:
    placing a substrate on a substrate-mounting plate;
    rotating the substrate-mounting plate while placing at least one drop of a photoresist solution onto the center of rotation of the substrate so that a photoresist is formed;
    exposing the photoresist with a means for projecting a laser beam spot onto the photoresist while rotating the substrate with the photoresist thereon; and
    moving linearly the projecting means and the substrate relative to one another in a direction parallel to the plane of the photoresist to produce a concentric pattern.

* * * * *